(12) United States Patent
Johnson

(10) Patent No.: US 6,758,948 B2
(45) Date of Patent: Jul. 6, 2004

(54) METHOD AND APPARATUS FOR DEPOSITING FILMS

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/227,526

(22) Filed: Aug. 26, 2002

(65) Prior Publication Data

US 2003/0042131 A1 Mar. 6, 2003

Related U.S. Application Data

(63) Continuation of application No. PCT/US01/04563, filed on Feb. 14, 2001.
(60) Provisional application No. 60/185,068, filed on Feb. 25, 2000.

(51) Int. Cl.[7] .............................................. C23C 14/34
(52) U.S. Cl. ........................... 204/192.12; 204/298.06; 204/298.08; 204/298.11
(58) Field of Search ..................... 204/298.03, 298.06, 204/298.08, 298.09, 298.11, 192.12

(56) References Cited

U.S. PATENT DOCUMENTS

| | | | |
|---|---|---|---|
| 3,878,085 A | 4/1975 | Corbani ....................... 204/298 |
| 3,884,793 A | 5/1975 | Penfold et al. .............. 204/298 |
| 3,995,187 A | 11/1976 | Penfold et al. .......... 313/346 R |
| 4,041,353 A | 8/1977 | Penfold et al. .............. 315/267 |
| 4,111,782 A | 9/1978 | Penfold et al. .............. 204/298 |
| 4,116,793 A | 9/1978 | Penfold et al. ......... 204/192 R |
| 4,116,794 A | 9/1978 | Penfold et al. ......... 204/192 R |
| 4,132,612 A | 1/1979 | Penfold et al. ......... 204/192 R |
| 4,132,613 A | 1/1979 | Penfold et al. ......... 204/192 R |
| 4,918,031 A | 4/1990 | Flamm et al. ............... 437/225 |
| 5,234,529 A | 8/1993 | Johnson ....................... 156/345 |
| 5,625,526 A | 4/1997 | Watanabe et al. ........... 361/234 |
| 5,688,357 A | 11/1997 | Hanawa ....................... 156/345 |
| 5,763,851 A | 6/1998 | Forster et al. .......... 219/121.43 |

(List continued on next page.)

FOREIGN PATENT DOCUMENTS

| | | | | |
|---|---|---|---|---|
| WO | WO 99/14855 | 3/1999 | ............ H03H/7/40 |
| WO | WO 99/25494 | 5/1999 | ............ B08B/7/00 |
| WO | WO 99/54909 | 10/1999 | .......... H01N/37/32 |
| WO | WO 00/03055 | 1/2000 | ........... C23C/14/32 |

OTHER PUBLICATIONS

Lieberman et al., Principles of Plasma Discharges and Materials Processing, New York: John Wiley & Sons, Inc., 1994, Chapter 12, pp. 387–411.

(List continued on next page.)

*Primary Examiner*—Steven Versteeg
(74) *Attorney, Agent, or Firm*—Pillsbury Winthrop LLP

(57) ABSTRACT

A method and apparatus for performing physical vapor deposition of a layer or a substrate, composed of a deposition chamber enclosing a plasma region for containing an ionizable gas; an electromagnetic field generating system surrounding the plasma region for inductively coupling an electromagnetic field into the plasma region to ionize the gas and generate and maintain a high density, low potential plasma; a source of deposition material including a solid target constituting a source of material to be deposited onto the substrate; a unit associated with the target for electrically biasing the target in order to cause ions in the plasma to strike the target and sputter material from the target; and a substrate holder for holding the substrate at a location to permit material sputtered from the target to be deposited on the substrate.

28 Claims, 7 Drawing Sheets

U.S. PATENT DOCUMENTS

| | | | |
|---|---|---|---|
| 5,792,522 A | | 8/1998 | Jin et al. .................... 427/575 |
| 5,800,688 A | | 9/1998 | Lantsman et al. ..... 204/298.11 |
| 5,968,327 A | | 10/1999 | Kobayashi et al. .... 204/298.11 |
| 5,976,327 A | | 11/1999 | Tanaka ................. 204/142.15 |
| 5,985,115 A | * | 11/1999 | Hartsough et al. ..... 204/298.09 |
| 6,358,376 B1 | * | 3/2002 | Wang et al. ........... 204/192.12 |
| 6,679,981 B1 | * | 1/2004 | Pan et al. .............. 204/298.06 |

OTHER PUBLICATIONS

Thornton, "Influence of apparatus geometry and deposition conditions on the structure and topography of thick sputtered coatings," J. Vac. Sci. Technol., vol. 11, No. 4, Jul./Aug. 1974, pp. 666–670.

* cited by examiner

METHOD AND APPARATUS FOR DEPOSITING FILMS

This application is a Continuation of International Application PCT/US01/04563, filed on Feb. 14, 2001 and claims the benefit of U.S. Provisional Application No. 60/185,068, filed on Feb. 25, 2000, the contents of both of which are hereby incorporated by reference.

BACKGROUND OF THE INVENTION

The present invention relates to the deposition of films, or layers, primarily in the fabrication of integrated circuits, but also in the manufacture of other products.

Integrated circuit fabrication procedures are composed of a variety of operations, including operations for depositing thin films on a semiconductor substrate, or wafer. Typically, a large number of identical integrated circuits are formed on such a wafer, which is then cut, or diced, into individual circuit chips.

Given the small dimensions of these integrated circuits, the quality of each deposited layer or film has a decisive influence on the quality of the resulting integrated circuit. Basically, the quality of a film is determined by its physical uniformity, including the uniformity of its thickness and its homogeneity.

In particular, several process steps require the ability to deposit high quality thin conductive films and to deposit conducting material in both high aspect ratio trenches and vias (and/or contacts).

According to the current state of the art, films, or layers, are deposited on a substrate according to two types of techniques: physical vapor deposition (PVD), which encompasses various forms of sputtering; and chemical vapor deposition (CVD). According to each type of procedure, a layer of material composed of a plurality of atoms or molecules of elements or compounds, commonly referred to collectively as "adatoms", is deposited upon a substrate in a low pressure region.

In typical PVD procedures, a target material is sputtered to eject adatoms that then diffuse through the low pressure region and condense on the surface of the substrate on which the layer is to be deposited. This material forms a layer on the substrate surface. Continuation of this process leads to the growth of a thin film. The sputtering itself is a physical process which involves accelerating heavy ions from an ionized gas, such as argon, toward the target surface, where the ions act to dislodge and eject adatoms of the target material as a result of momentum exchange which occurs upon collision of the ions with the target surface.

On the other hand, in CVD procedures, two or more gases are introduced into a vacuum chamber where they react to form products. One of these products will be deposited as a layer on the substrate surface, while the other product or products are pumped out of the low pressure region.

Both types of deposition processes are advantageously performed with the assistance of a plasma created in the low pressure region. In the case of PVD processes, it is essential to provide a primary plasma to generate the ions that will be used to bombard the target. However, in these processes, a secondary plasma may be formed to assist the deposition process itself. In particular, a secondary plasma can serve to enhance the mobility of adatoms in proximity to the substrate surface.

Although CVD processes are widely used in the semiconductor fabrication industry, processes of this type have been found to possess certain disadvantages. For example, in order to employ CVD for a particular deposition operation, it is necessary to be able to create a chemical reaction that will produce, as one reaction product, the material to be deposited. In contrast, in theory, any material, including dielectric and conductive materials, can be deposited by PVD and this is the process of choice when deposition must be performed while maintaining the substrate temperature within predetermined limits, and particularly when deposition is to be performed while the substrate is at a relatively low temperature.

A film composed of a dielectric material can be formed by PVD either by directly sputtering a target made of the dielectric material, or by performing a reactive sputtering operation in which a conductive material is sputtered from a target and the sputtered conductive material then reacts with a selected gas to produce the dielectric material that is to be deposited. One exemplary target material utilized for direct sputtering is silicon dioxide. PVD can also be used for conductive layers.

The simplest known PVD structure has the form of a planar diode which consists of two parallel plate electrodes that define cathode constructed to serve as the target and an anode which supports the substrate. A plasma is maintained between the cathode and anode and electrons emitted from the cathode by ion bombardment enter the plasma as primary electrons and serve to maintain the plasma.

While a target made of a conductive material can be biased with a DC power supply, a target made of a dielectric material must be biased with high frequency, and particularly RF power, which can also assist the generation of ions in the plasma. The RF power is supplied to the target by a circuit arrangement including, for example, a blocking capacitor, in order to cause the applied RF power to result in the development of a DC self-bias on the target.

Since the planar diode configuration is not suitable for efficient generation of ions, DC and RF magnetron configurations have been developed for producing a magnetic field having field lines that extend approximately parallel to the target surface. This magnetic field confines electrons emitted from the target within a region neighboring the target surface, thereby improving ionization efficiency and the creation of higher plasma densities for a given plasma region pressure.

Additional configurations followed including the variety of cylindrical magnetrons. Several versions of the cylindrical magnetron variation have appeared in the patent prior art, in particular, the family of U.S. Pat. Nos. 4,132,613, 4,132,612, 4,116,794, 4,116,793, 4,111,782, 4,041,353, 3,995,187, 3,884,793 and 3,878,085.

As described in Thornton in "Influence of Apparatus Geometry and Deposition Conditions on the Structure and Topography of Thick Sputtered Coatings", J. Vac. Sci. Technol., Vol 11, No 4, 666–670 (1974), the structure of a deposited metal film is dependent on both the temperature of the substrate and the gas pressure within the plasma region. The highest film quality can be achieved when the substrate is at a relatively low temperature and conditions are created to effect a certain level of bombardment of the substrate with ions from the plasma while the film is being formed. When optimum conditions are established, a dense, high quality thin film which is substantially free of voids and anomalies can be achieved.

It is known in the art that bombardment of the substrate with ions having energies under 200 eV, and preferably not greater than 30 eV, and more preferably between 10 and 30 eV, can result in the formation of dielectric films having optimum characteristics. This has been found to be true in the case of, for example, thin films of $SiO_2$ and $TiO_2$.

Achievement of high deposition rates and optimum quality of the deposited layer requires a high energy density in the plasma adjacent both the target and the substrate. Plasma energy flux (with units of $J/m^2$-sec) is the product of the ion flux (with units of number of $ions/m^2$-sec) and ion energy (with units of J/ion).

However, whereas the highest possible ion energy is desired adjacent the target to maximize the target sputtering rate, it has been found that the ion energy adjacent the substrate, i.e., the energy of ions that bombard the substrate, should be less than the maximum achievable for reasons relating primarily to layer quality.

For example, a reduced ion energy in the plasma adjacent the substrate reduces the rate of implantation of plasma gas ions into the substrate, as well damage to the substrate subsurface, and the creation of voids and mechanical stresses in the layer being formed.

Therefore, while it is desirable to have a high ion density in the plasma adjacent both the target and the substrate, different desiderata exist with respect to plasma ion energy. The plasma density in these systems are quite uniform, ie within +/−20% due to diffusion.

The plasma energy flux to the target and to the substrate are each limited by the ability to remove heat from the target or substrate/chuck, respectively. Moreover, the ion energy associated with ions striking the substrate surface is desired to be limited to a maximum value to assure layer deposition quality. Therefore, it is imperative to use a plasma source capable of generating a dense plasma ($>10^{12}$ $cm^{-3}$) or, equivalently, a high ion current density at the target and substrate surfaces while enabling direct control of the ion energy via other means.

For PVD of conductive material, an electron cyclotron resonance (ECR) plasma source is known, capable of generating plasmas with a density in the range of $10^{12}$ $cm^{-3}$ and higher. However, the plasma density proximate the substrate is often significantly reduced since the substrate is generally downstream from the plasma source.

In general, known systems are not suitable for both generating a high density plasma and allowing appropriate control of the ion energy delivered to the substrate. Specifically, when, in the known systems, the plasma density is increased, the plasma potential is correspondingly raised and this leads to high sheath voltages and high ion energies in the vicinity of the substrate.

Furthermore, a growing problem associated with many PVD chambers is a lack of directivity for the adatom specie. Subsequently, when filling high aspect vias and trenches, the feature may be "pinched off" prematurely due to deposition coating growth on the feature side-walls. Therefore, the concept of "ion plating" was introduced wherein a fraction of the adatom specie is ionized and attracted to the substrate surface by means of a substrate bias. Consequently, the directed (normal) flow of ionized adatom specie enabled a uniform coating growth without pinch-off; see U.S. Pat. No. 5,792,522.

In addition, an inherent problem associated with the use of inductively coupled plasma sources for conductive material PVD applications is the development of conductive coatings on the chamber walls. Once this thin coating exceeds some thickness (~400 A), the wall coating becomes sufficiently conductive that the plasma source ceases to sustain a plasma. In both U.S. Pat. Nos. 5,800,688 and 5,763,851, a circumferential shield comprising longitudinal and transverse structures is employed to limit the field of view of sputtered material migrating towards the chamber walls, hence, interrupting the generation of a continuous wall coating of conducting material. FIG. 1 of U.S. Pat. No. 5,800,688 shows a series of angular blade sections displaced circumferentially, whereas FIG. 2 U.S. Pat. No. 5,763,851 shows a series of concentric shields comprising longitudinal slots, with slots alternately placed between adjacent layers.

BRIEF SUMMARY OF THE INVENTION

A primary object of the present invention is to form high quality films on a substrate.

Another object of the present invention to provide a method and apparatus for performing PVD in a plasma region which contains a high density plasma and in which the target is bombarded with high energy ions and the substrate is bombarded with comparatively low energy ions.

A further object of the invention is to allow independent control of the target and substrate bombardment ion energies.

A further object of the invention is to achieve high target material sputter rates in order to produce corresponding high film deposition rates.

Yet another object of the invention is to provide a novel target electrode structure which allows the desired high sputtering rate to be achieved.

Further objects of the invention are to reduce particle contamination due to complex geometric features in the process chamber, and to improve the efficiency of coupling RF power to the plasma.

Another object of the invention is to eliminate certain obstacles to the plasma-assisted deposition of conductive layers on substrates.

A still further object of the invention is to control the buildup of sputtered material on the chamber walls.

The above and other objects are achieved, according to the present invention, by apparatus for performing physical vapor deposition of a layer on a substrate, which apparatus includes a deposition chamber enclosing a plasma region for containing an ionizable gas, and electromagnetic field generating means surrounding the plasma region for inductively coupling an electromagnetic field into the plasma region to ionize the gas and generate and maintain a high density, low potential plasma. A source of deposition material including a solid target is installed in the chamber. The solid target contains a material which is to be deposited onto the substrate. The target is electrically biased in order to cause ions in the plasma to strike the target and sputter material from the target. The apparatus further includes a substrate holder for holding the substrate at a location to permit material sputtered from the target to be deposited on the substrate.

In preferred embodiments of the apparatus according to the invention, the electromagnetic field generating means comprise an electrostatically shielded radio frequency electromagnetic field source that includes an electrostatic shield surrounding the plasma region and a coil surrounding the shield for converting RF power into an electromagnetic field that is coupled into the plasma through the electrostatic shield.

It has been found that a source of this type is capable of generating a high density plasma, which makes possible the achievement of high target sputter rates and high substrate deposition rates while maintaining a low plasma potential and, hence, enabling independent control of the DC self-bias induced in each of the target and substrate.

Objects according to the invention are further achieved by the provision, in such apparatus, of a target assembly constructed to have the following features: the area of the target is small relative to the unbiased area of the chamber, thereby maximizing DC self-bias of the target; a match network is provided for permitting application of a high frequency RF voltage to create the self-bias, the target presenting a low impedance to high frequencies; the match network is constructed to minimize harmonics of the high frequency on the target; some RF power is capacitively coupled to the target; the target is brazed to a stainless steel plate which maximizes heat transfer from the target to a heat removal system; the heat removal system is constructed to be capable of high heat removal rates, typically in excess of 10 W/cm$^2$; and a network for monitoring electrode arcing is provided.

Objects according to the invention are further achieved by the provision of a substrate holder in the form of a chuck having the following features: the chuck is constructed to electrostatically clamp the substrate to the chuck; a system for delivering gas to the lower surface of the substrate is provided; the chuck is constructed to remove heat at a high rate from the substrate; and a RF bias is applied to the chuck in order to induce a DC self-bias in the substrate. The combination of all four of these features will facilitate the delivery of a high ion flux to the substrate and, consequently, high deposition rates, while ions having a relatively low energy also impact on the substrate. As noted earlier herein, a certain amount of low energy in bombardment is needed to produce the highest quality depositing films.

In further accordance with the invention, the electrostatic shield of the electromagnetic field generating means is arranged to be electrically and/or thermally biased. The application of such bias during a sputtering process or between sputtering operations can serve to remove material that has been deposited on the inner surface of the shield, which constitutes a lateral wall of the deposition chamber. This at least reduces, if not completely eliminating, wall contamination and, thus, subsequent substrate contamination. The thickness of material deposited on the wall can be monitored, and this will provide an indication of when a wall cleaning is required.

Also in accordance with the invention, the apparatus may be configured to permit deposition of conductive material by providing a dielectric process tube that surrounds and delimits the plasma region and a bias shield that surrounds the process tube and is used for monitoring the thickness of a conductive material layer deposited on the process tube and to provide a bias voltage that acts to sputter the conductive material off of the process tube.

DETAILED DESCRIPTION OF THE INVENTION

The first embodiments to be described are particularly suitable for sputtering and depositing dielectric material.

Figure 1:
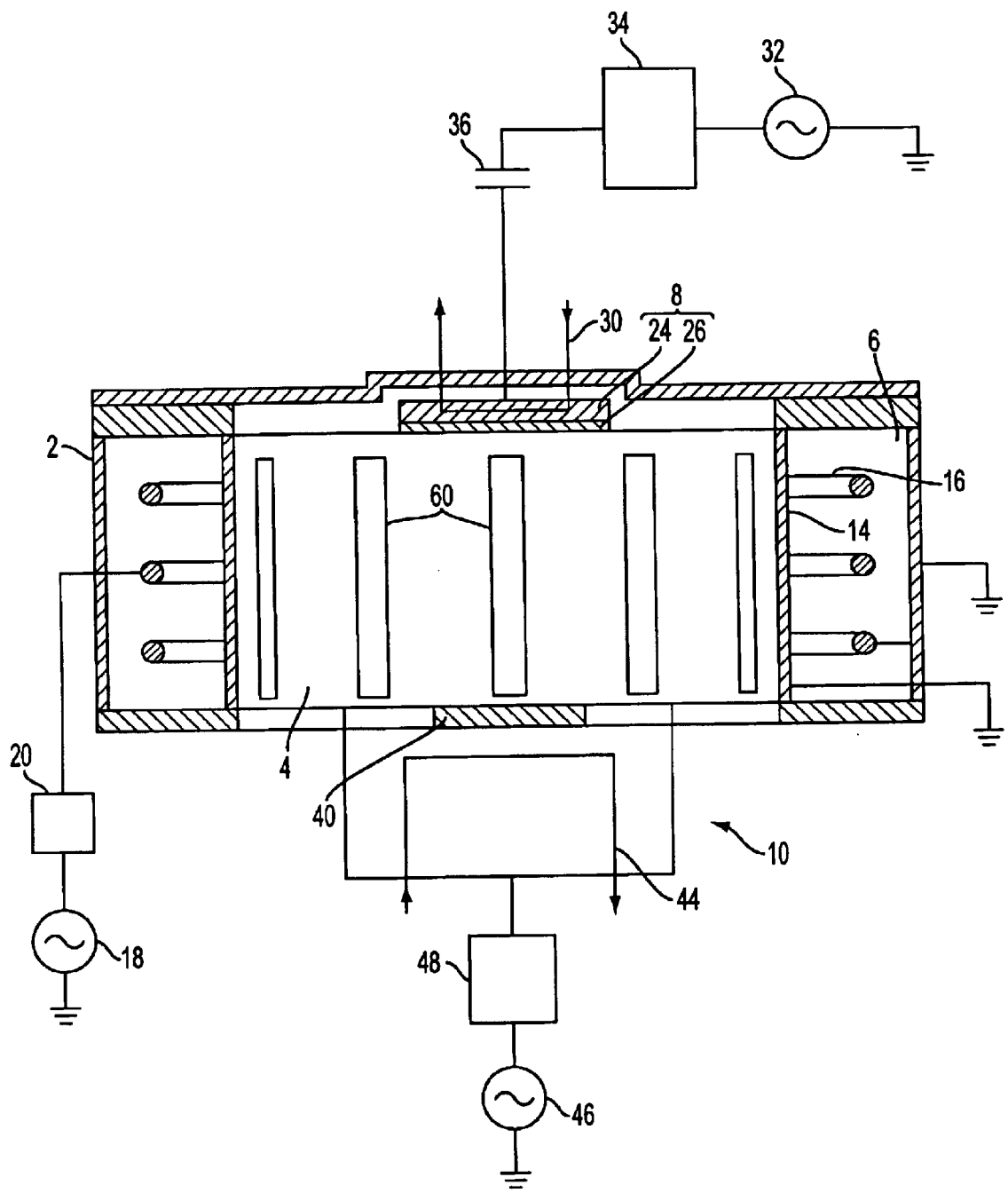
FIG. 1 is an elevational view, partly in cross-section and partly pictorial, of a first embodiment of a PVD apparatus according to the invention.

FIG. 1 illustrates a first embodiment of an apparatus according to the present invention for performing physical vapor deposition, on a substrate, of a layer of a dielectric material sputtered from a target. The apparatus is composed of a housing 2 that encloses a plasma chamber 4, an annular coil enclosure 6, a target assembly 8 and a substrate holder 10. Plasma chamber 4 is separated from coil enclosure 6 by a cylindrical conductive sheet 14 that serves as an electrostatic shield.

Coil enclosure 6 contains a multi-turn helical coil 16 connected between ground and a series arrangement of a RF power generator 18 and a matching network 20.

Housing 2 is also connected to ground and conductive sheet 14 is connected to ground, at least during the major portion of a deposition process. Target 8 is composed basically of a metal plate 24 and a dielectric sheet, or plate, 26 constituting the source of material to be sputtered and deposited on a substrate. Metal plate 24 is provided with passages forming part of a coolant flow path 30 through which a coolant fluid flows during deposition operation. Plate 24 is conductively connected to a RF power generator 32 via a series arrangement of a matching network 34 and a blocking capacitor 36.

Substrate holder 10 provides a support surface for a substrate 40 on which the layer is to be deposited. Substrate holder 10 is provided with flow passages forming part of a coolant flow path 44 for flow of a coolant that will remove heat from substrate 40. Substrate holder 10 is connected to a RF power generator 46 via a matching network 48 provided to maximize power transfer to holder 10.

Figure 4:
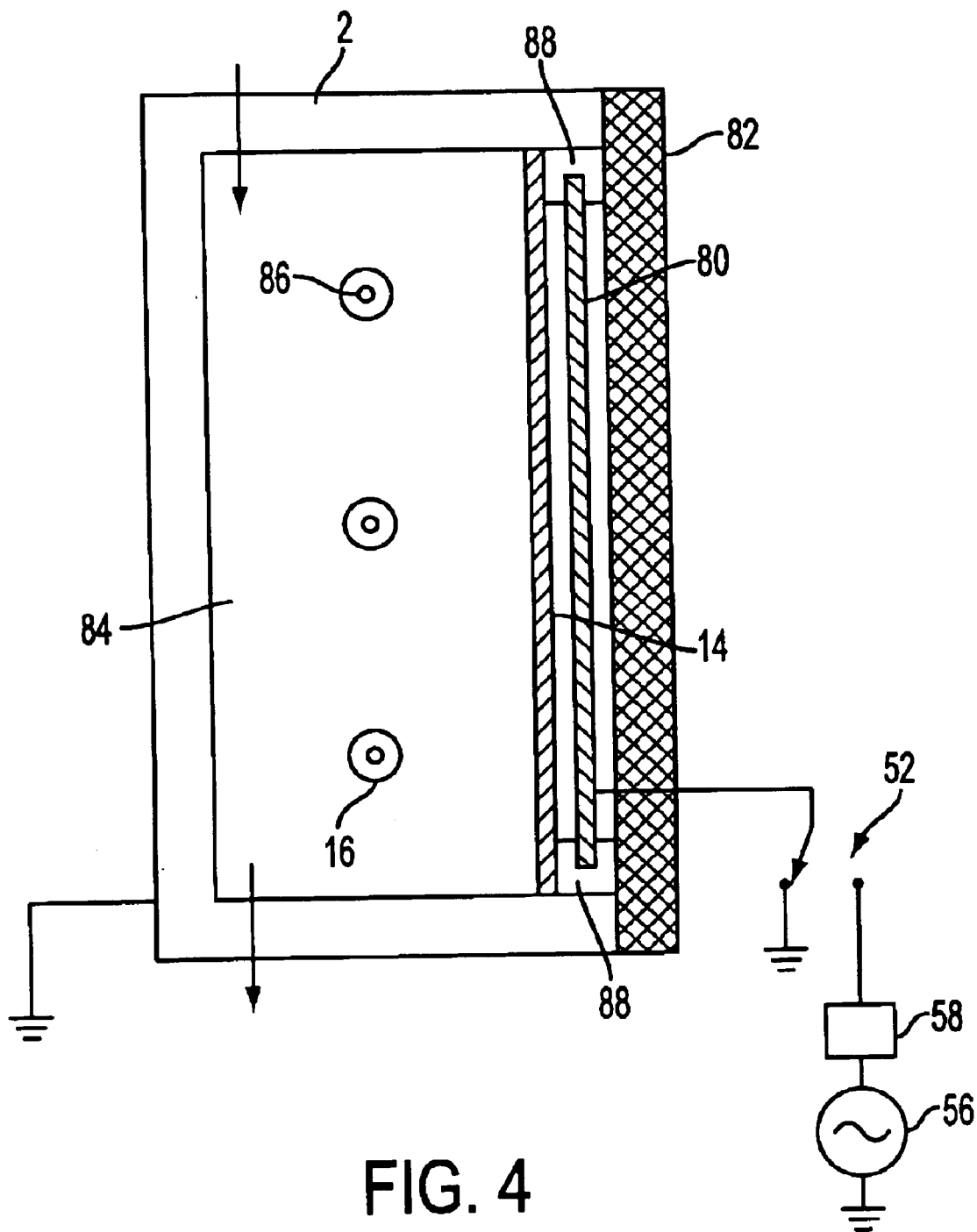
FIG. 4 is a cross-sectional, detail view of a portion of a modified version of the apparatus of FIG. 1 or FIG. 3 for PVD of conductive materials.

As shown in FIG. 4, to be described in detail below, it is desirable that electrostatic shield 14 be well ground at the top and bottom and maintained permanently at ground potential. A second electrically isolated shield, or bias shield, 80 is provided between shield 14 and a process tube 82 made of dielectric material. Shield 80 may be used for imposing an electrical wall bias to remove deposited layers thereon.

Conductive sheet 14 is provided with an array of slots 60 via which electromagnetic energy generated by coil 16 is coupled into plasma chamber 4. Slots 60 will be closed by dielectric windows, or sheet 14 may entirely encircle a cylindrical process tube, such as tube 82 of FIG. 4.

In the arrangement illustrated in FIG. 1, coil 16 and conductive sheet 14 constitute the essential components of an electrostatically-shielded radio frequency (ESRF) plasma source that is already known in the art. For example, generators of this type are described in U.S. Pat. Nos. 4,918,031 and 5,234,529, as well as in Lieberman and Lichtenberg, Principles of plasma discharges and materials processing, Chapter 12, John Wiley and Sons, inc. (1994). As described in the latter text, coil 16 can be configured to form a helical resonator by giving coil 16 a length equal to an integral number of quarter wavelengths of the RF input signal. The point on coil 16 to which RF power is supplied from generator 18 is located close to one end of the coil which is grounded. This portion of the coil effectively serves as part of the matching network, enabling selection of a tap position for achieving a match condition. Under certain conditions, proper selection of the tap point location can provide the desired impedance matching for the circuit. The open-circuited part of coil 16 provides a termination that is resonant at the RF.

In accordance with the usual practice in the art, enclosure 6 is filled with a bath of a dielectric fluid, one example of which is sold under the trademark FLUORINERT, an inert perfluorinated fluid in order to maintain coil 16 at a desired temperature.

The purpose of matching network 20 is to match the power supply output impedance to the load impedance as represented by the intrinsic impedance of coil 16 and the impedance of the plasma established in chamber 4, in order to maintain efficient energy transfer to the plasma. Matching networks for achieving this result are already known in the art.

According to preferred embodiments of the invention, metal plate 24 and other target components connected to generator 32 are preferably made of stainless steel and the target material is attached to plate 24 in a manner dictated by the nature of the materials involved. For example, the target, or dielectric plate, 26 may be made of alumina, which will be brazed to copper plate 24. One advantage of brazing is that it will maximize the heat transfer conductance between plates 24 and 26.

The load impedance on power supply 18 is a function of the intrinsic impedance of coil 14 and the impedance presented by a plasma created in chamber 4. The impedance of the plasma will vary significantly between that which exists prior to plasma ignition and that which exists while a plasma is being maintained. Matching network 20 is provided essentially to maintain efficient energy transfer from generator 18 to the plasma despite such load impedance variations.

Each matching network 20, 34, 48 and 58 may be an L-network composed of two variable capacitors and an inductor, the capacitors being mechanically adjustable by an automatic control network in order to maintain the desired impedance match. Typically, the source impedance of an RF generator is of the order of 50 Ω and the variable match network components will be adjusted so that the output impedance of the match network is the complex conjugate of the input impedance to the plasma source. Under matched conditions, the forward power at the match network junction is maximized and the reflected power is minimized. Use can be made of known matching network designs which, while differing from one another in speed, robustness and controllability, are based upon the same fundamental principles which are abundantly described in the art. The provision of series connected blocking capacitor 36 serves to promote the development of a high level DC self-bias voltage on plates 24 and 26.

The RF bias applied to target 26 must exceed the sputtering threshold of the target, which is typically between 60 and 100 volts. The sputtering yield will then increase linearly as a function of voltage until reaching a level between 500 and 1000 volts. The optimum operating point for a target is that at which the sputtering yield per unit power absorbed is a maximum. The sputtering yield itself is basically dependant on the power dissipated at the target. This power is limited by the thermal conductivity of the target material and the rate of heat conduction to the coolant flow path. A typical, efficient target design can dissipate on the order of 10 W/cm$^2$.

Furthermore, the area of target 26 should be small relative to the area of the grounded or unbiased surfaces delimiting the plasma chamber in order to assure a high DC self-bias at target 26. This derives from the known fact that when a potential exists between two electrodes, and one electrode has an area substantially different from the other, the resulting DC self-biased will be relatively large.

In further accordance with the present invention, the RF power produced by generator 32 should be at a very high frequency, preferably higher than 50 MHz. When dielectric target 26 has a thickness of several millimeters, it is necessary that capacitive coupling to the front, or exposed, surface of target 26 provide the mechanism for transmitting power through target 26. The following Table 1 provides one preferred exemplary set of specifications for performance of a deposition process according to the invention in apparatus of the type shown in FIG. 1.

TABLE 1

| Target Specifications | |
| --- | --- |
| Target power density (W/cm$^2$) | 10 |
| Target voltage (volts) | 333.33 |
| Target current density (amps/cm$^2$) | 0.03 |
| Target diameter (in (cm)) | 8 (20.32) |
| Target area (in$^2$ (cm$^2$)) | 50.3 (324.3) |
| Target power (W) | 3242.9 |
| Total target current (amps) | 9.7 |
| Target impedance (ohms) | 34.3 |

In further accordance with the invention, the structure for supplying RF power from generator 32 to target electrode 24 may be constructed to reduce the amplitude of harmonic components of the RF power. The presence of harmonic components having significant amplitudes can lead to a non-uniform spatial distribution of the electric field that is coupled from electrode 24 into the plasma in chamber 4. Even though only the fundamental RF power frequency is coupled to target electrode 24 and ultimately couples power at this frequency into the plasma, harmonics of that fundamental frequency can be generated within the plasma due to the inherent nonlinearity of the plasma, and in particular the plasma sheaths, which are thin boundary layers of the plasma adjacent to electrode surfaces. Within the plasma sheath adjacent to dielectric plate 26, power at the fundamental RF frequency can be redistributed to harmonic frequencies by a nonlinear waveform rectification mechanism. Electric field components at these harmonic frequencies can then appear in target 24, 26 because it directly interfaces with the plasma. In many cases, harmonic energy can then be reflected at impedance mismatches, such as may exist at the base of the match network, and this reflected energy is returned to the plasma.

In order to obtain an improved target sputtering uniformity, it is therefore desirable to incorporate harmonic reduction techniques. One such approach would be the construction of a conical, coaxial RF transmission line for feeding the RF power to target 24, 26 in order to make the line transparent to harmonic frequencies. Wave propagation along the line may be attenuated using a dielectric material having a significant dielectric or magnetic loss tangent, δ within a coaxial conductor or by using RF filtering techniques. Construction of such arrangements can be based on knowledge already existing in the art, as disclosed, for example, in Provisional application 60/182,187 filed by Windhorn on Feb. 14, 2000. When, for example, a high density plasma, of the order of $10^{12}$ ions/cm$^3$, is generated in chamber 4, with ion current densities of the order of 30 mA/cm$^2$ flowing to the surface of dielectric plate, or sputter target plate 26, together with the creation of high ion energies, a high energy flux can be created at the target surface. By maximizing the energy flux to the target surface and optimizing its breakdown between ion flux and ion energy, a maximum sputter yield can be created.

Substrate holder 10 includes a chuck, which may be an electrostatic chuck, for holding substrate 40 in place. Substrate holder 10 is mounted to be capable of undergoing vertical movement in order to bring substrate 40 to a desired level with respect to chamber 4. Vertically moveable substrate holders are already well known in the art. In accordance with the present invention, this capability may be employed to position the upper surface of substrate 40 just slightly below the lower extremities of slots 60. The density of the inductively coupled plasma produced in chamber 4 decays rapidly below the lower extremities, and above the upper extremities, of slots 60. The rate of decay is strongly dependent upon the pressure within chamber 4. The density becomes nearly zero within a few centimeters above and below the slot extremities. This allows the upper surface of substrate 40 to be located in proximity to a region of high plasma density, while itself being in a region of low plasma density, thereby allowing a low level of ion energy to be achieved at the substrate surface. This level can be controlled by suitable selection of the substrate self-bias voltage.

Substrate holder 10 is further constructed to maintain the substrate at a specified temperature by incorporating therein a cooling system, including a coolant flow path 44, capable of removing heat from substrate 40 at a rate of the order of 5–10 W/cm$^2$. Thermal conduction between substrate 40 and substrate holder 10 is improved by supplying a layer of gas therebetween and by creating electrostatic forces to hold substrate 40 against holder 10. The combination of a layer of gas and electrostatic clamping, each of which is conventional in the art, serves to increase the thermal conductivity in the interface region between substrate 40 and substrate holder 10. One such device in the prior art is described in U.S. Pat. No. 5,625,526 (Watanabe et al.) entitled "Electrostatic Chuck".

At the bottom of chamber 4, holder 10 is surrounded by an annular region which is in communication with a ducting system (not shown) leading to a vacuum pump, such as a turbomolecular pump, that maintains a desired vacuum pressure within chamber 4. RF power is supplied by generator 46 to substrate holder 10 for the purpose of establishing a DC self-bias on substrate 40.

The RF bias supplied to holder 10, and substrate 40, by generator 46, will preferably achieve a low level DC self-bias in substrate 40. A separate blocking capacitor is not required because the insulating layer provided by an electrostatic chuck between conducting parts of holder 10 and substrate 40 will provide sufficient capacitance to allow the desired self-bias to be created. By way of example, the insulating material employed for this purpose may be KAPTON, a polyimide film, if the temperature of the wafer is within the operating range.

The low level DC self-bias imposed on substrate 40 attracts ions to substrate 40 at a suitable rate to effect ion assisted deposition while achieving the other advantages described earlier herein, namely reduced gas atom implantation in the substrate surface, subsurface damage and other adverse effects on the quality of the deposited layer.

When a suitable gas, such as argon, for example, is introduced at a selected pressure into chamber 4 and RF current is supplied from generator 18 to coil 16, the electromagnetic field radiated from coil 16 and passing through slots 60 will ionize the gas in chamber 4 and thus create a plasma containing ions. According to preferred embodiments of the invention, conditions are established to create a high density plasma, which is generally defined as a plasma having a density on the order of $10^{12}$ ions/cm$^3$. In addition, RF power is supplied from generator 32 to metal plate, or target electrode, 24 and dielectric plate, or target, 26. This RF power serves to create a DC self-bias at target assembly 24, 26. This self-bias acts to attract ions in the plasma to dielectric plate 26, where impact of the ions on plate 26 produces the desired sputtering action. According to one feature of the present invention, a relatively high DC self-bias is imposed on target electrode 24 and target 26 in order to cause target 26 to be bombarded with a high ion flux of high energy ions, thereby promoting a high sputter yield.

Preferably, the DC self-bias is selected to achieve the highest possible sputter yield consistent with the ability of the target system to remove heat generated by the sputtering operation. Thus, coolant flow path 30 is constructed to produce a high efficiency cooling action.

During operation, heat is removed from substrate holder 10 and substrate 40 by a coolant which flows through flow path 44. Because of the low level of the DC self-bias induced in substrate 40, the heating of substrate 40 is less than that of target 26. However, a coolant flow arrangement is necessary to maintain substrate 40 at an optimum processing temperature.

A plasma source of the type described herein is capable of subjecting the plasma gas to both dissociation and ionization. In general terms, when the gas in chamber 4 is at a relatively high pressure, for example 1 Torr, and the applied electromagnetic field has a relatively low power density, for example 1 W/cm$^3$, the plasma has a high dissociation rate and a low ionization rate. Conversely, the ionization rate increases as the power increases and the pressure decreases.

As mentioned earlier herein, the purpose of slots 60 is to provide a path for transfer of energy from coil 16 to the interior of chamber 4, or, in other words, to inductively couple the RF power radiated by coil 14 into the plasma. In order to optimize the performance of an arrangement according to the present invention, slots 60 are located and dimensioned in order to minimize capacitive coupling of the RF power to the plasma. Although capacitive coupling facilitates plasma initiation, so that some capacitive coupling is desirable, it inherently generates large and often uncontrollable plasma potentials after plasma initiation. Such large, uncontrollable plasma potentials generally lead to significant sputtering of the chamber walls, producing sputtered material which will then contaminate the substrate. Thus, by primarily inductively coupling the RF power into the plasma via slots 60, the ESRF source can generate a plasma having a very low potential, thereby minimizing the DC self-bias induced on the chamber walls, particularly the inner surface of sheet 14, and it is possible to maintain a low DC self-bias on substrate 40. When the self-bias on substrate 40 has a low level, the substrate will be subjected to low energy level bombardment by ions in the plasma.

Slots 60 are dimensioned and positioned to achieve a desired ratio between RF power that is capacitively coupled into chamber 4 and RF power that is inductively coupled therein. The value of this ratio will be dependent on the width, length, and position of each slot 60 relative to coil 16. In view of the effectiveness of capacitive coupling in initiating a plasma, a certain percentage of RF power coupled into chamber 4 should be capacitively coupled. It presently appears that a suitable ratio between capacitively coupled power and inductively coupled power will be achieved if the total area of slots 60 is between 0.2% and 5% of the total surface area of conductive sheet 14. The dimensions of slots 60 can be adjusted in-situ to minimize the existence of ions with excessive energy.

The electrostatic shield may, according to the embodiments of the invention, be constituted by a stainless steel chamber wall delimiting plasma chamber 4, with slots 60 being cut in the wall and the resulting openings being covered with dielectric material or fitted with elongated dielectric windows.

Figure 2:
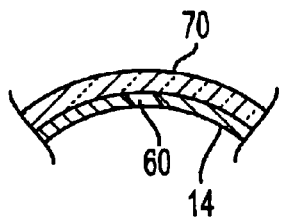
FIG. 2 is a cross-sectional, detail view of one structural feature of the apparatus of FIG. 1.

According to preferred embodiments of the invention, the dielectric windows may be constituted by a dielectric sheet 70 surrounding shield 14, and slots 60 may be cut at an angle through shield 14, as illustrated in FIG. 2, in order to minimize impingement of ions on dielectric sheet 70. In particular, the form for slots 60 shown in FIG. 2 will reduce impingement of ions which follow trajectories normal to the interior surface of shield 14. In addition, when the dielectric windows are formed by a sheet surrounding shield 14, sputtering of the dielectric windows is minimized.

In order to perform a deposition operation according to the invention, vacuum chamber 4 will initially be evacuated by means of a turbo-molecular pump or other pumping mechanism to achieve a chamber pressure within the range of 0.1 mTorr to 1 Torr. Typically, a chamber pressure between 1 and 100 mTorr is desired. Then, an ionizable working gas such as argon is introduced into chamber 4 and RF power is delivered to coil 16, which therefore radiates energy into chamber through slots 60 in order to create an electromagnetic field that is coupled to the gas in chamber 4. As a result, this gas is ionized to produce a plasma. The gas pressure within chamber 4 and the energy supplied to coil 16 are selected to produce a high density plasma, while the predominant inductive coupling of energy into chamber 4 allows that plasma to have a low plasma potential. A low plasma potential is here considered to be a plasma potential having an upper limit of 10V.

During this operation, shield 14 is connected to ground and RF power is supplied to target assembly 8 in order to create a high DC self-bias voltage at plate 26. This high voltage causes plate 26 to be bombarded with high energy ions, resulting in a high sputter yield.

At the same time, a low level of DC self-bias is imposed on substrate 40 in order to optimize the quality of the layer of sputtered material deposited thereon.

During this operation, a coolant is caused to flow through paths 30 and 44 at rates sufficient to maintain plate 26 and substrate 40 at selected temperatures.

As discussed earlier, the electrostatic shield should be grounded and a second shield, the bias shield, electrically isolated from ground and from the electrostatic shield, should be used for electrical wall biasing.

DC self-bias can also be created on sheet 14 if it should be found that a given deposition operation can be improved by varying the degree of capacitive coupling of the RF power to the plasma. Further details regarding such biasing of sheet 14 are described in pending International Application No. PCT/US98/23248, filed by Wayne L. Johnson on Nov. 13, 1998 and entitled ALL SURFACE BIASABLE AND/OR SURFACE TEMPERATURE CONTROLLED ELECTROSTATICALLY SHIELDED RF PLASMA SOURCE, the entire disclosure of which is incorporated herein by reference.

By way of summary, it should be understood that the present invention achieves improved film deposition on a substrate by generating a plasma having a high density but a low plasma potential, while generating a high DC self-bias voltage on the target and a comparatively low DC self-bias voltage on the substrate upon which the film is to be deposited.

Figure 3:
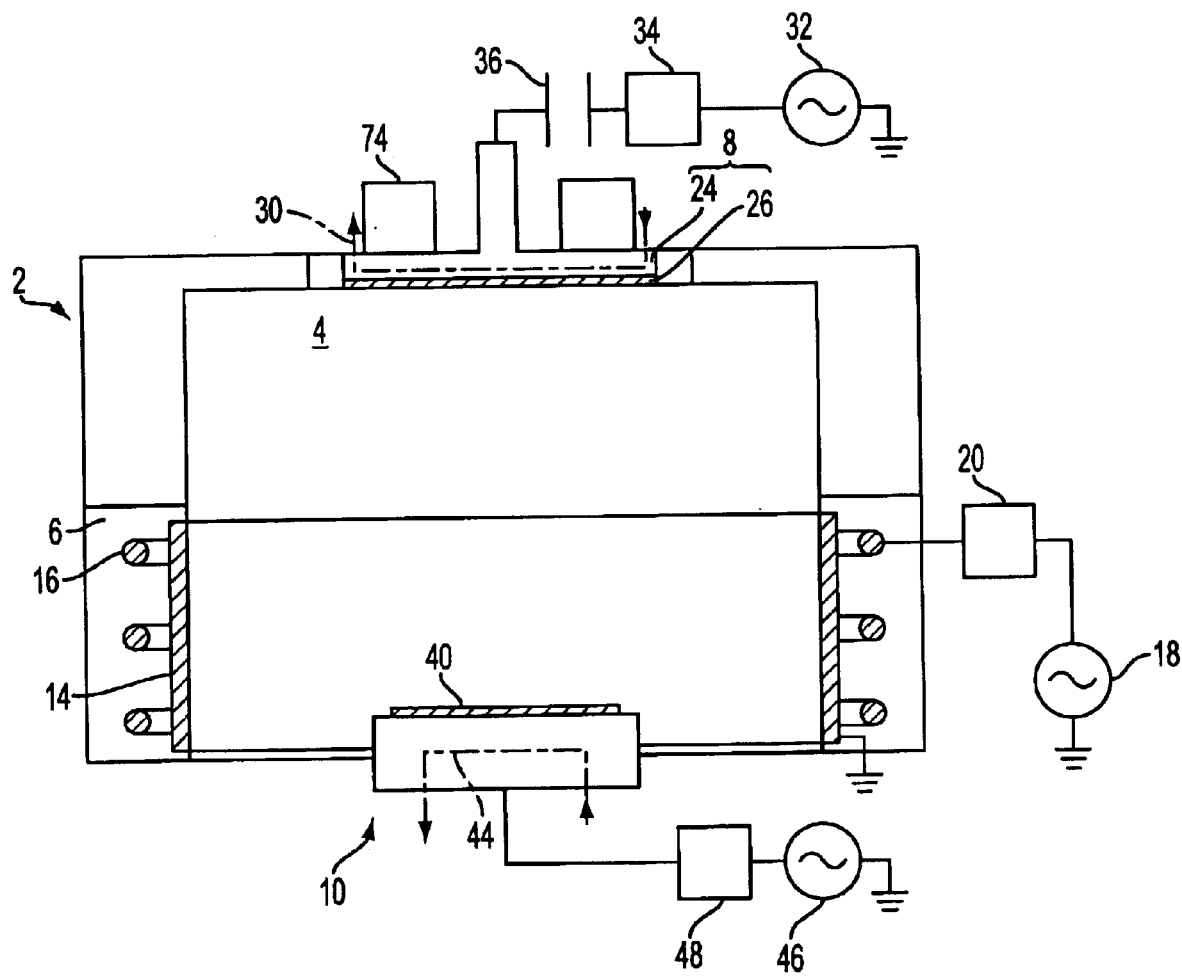
FIG. 3 is a view similar to that of FIG. 1 of a second embodiment of PVD apparatus according to the invention.

A second embodiment of apparatus according to the invention is illustrated in FIG. 3. This embodiment includes essentially the same components as those described above with respect to FIG. 1 and differs from the embodiment of FIG. 1 essentially in its geometry and in the provision of a magnet arrangement 74 behind target assembly 8.

More specifically, the embodiment shown in FIG. 3 differs from that of FIG. 1 in the following respects: plasma chamber 4 is elongated in the vertical, or axial, direction and RF power source 14, 16 has a relatively reduced axial height, being confined essentially to the lower half of chamber 4; and magnet assembly 74 is provided to augment the rate at which target material is sputtered. Such a magnetic assembly can also be used with the embodiment of FIG. 1

Magnet assembly 74, commonly referred to as a planar magnetron, is constructed according to principles already known in the art to produce a magnetic field having field lines parallel to the surface of plate 26 from which material is to be sputtered. This field acts to trap electrons, and thus locally confine the plasma, adjacent the surface from which material is to be sputtered. Such a magnetic assembly can also be used with the embodiment of FIG. 1.

In the device of FIG. 3, two somewhat distinguishable plasmas are produced, one being locally adjacent the surface of plate 26 and the other being generated by the field produced by coil 16.

The magnetic field produced by assembly 74 allows a high sputter yield to be produced while the DC self-bias on target assembly 8 is lower than that required in the embodiment shown in FIG. 1. The reduced DC self-bias allows the main plasma formed by inductive coupling with the electromagnetic field radiated from coil 16 to have a reduced plasma potential relative to that which would be established in chamber 4 of the embodiment shown in FIG. 1. The higher plasma potential in the embodiment of FIG. 1 is due primarily to the fact that a higher RF bias voltage applied to target assembly 8 also increases the capacitive coupling of energy into the plasma. The reduced plasma potential made possible by the embodiment of FIG. 3 enhances the controllability of the energy of ions which impinge on the surface of substrate 40. The walls of the process chamber may be sputter cleaned with the bias shield to prevent particulate contamination of the substrate and to increase the time between disassembly operations of the chamber to physically clean the walls.

The embodiments described above are particularly suitable for sputtering and depositing dielectric materials. However, there is also a need in this field for depositing films, or layers, of conductive materials. These operations present several problems and requirements different from those posed by dielectric materials. The present invention is also suitable for conductive material deposition, particularly if certain modifications are made to the embodiments already described in order to optimize both the operation of the apparatus and the processing result.

One of these modifications takes into account the effects of deposition of sputtered conductive materials on process chamber walls. During any PVD process, some of the material sputtered from the target will be deposited on virtually every surface exposed to the plasma, including the process chamber walls. Deposition of sputtered dielectric material on the chamber walls does not have any significant adverse effect on the deposition result or the operating state of the apparatus. However, it will be necessary to clean the chamber walls when the sputtered material has been deposited thereon to a certain thickness to prevent generation of particulates.

On the other hand, although deposition of sputtered conductive material on chamber walls in a thin layer of not greater than 400 Å is tolerable and it is even desirable to have a layer of sputtered material at least one molecule thick to insure a clean vacuum environment for the deposition process, thicker layers will have a detrimental effect because the load impedance seen by the RF power source will vary with the thickness of the conductive coating on the process tube wall and the conductive material will coat the dielectric windows via which electromagnetic energy is coupled into the plasma and diminish the transmission of electromagnetic energy through the dielectric windows diminishes.

According to one feature of the present invention, a system is provided for monitoring the thickness of the coating of sputtered material on chamber walls and initiating a cleaning operation when the thickness is found to exceed a predetermined value, such as 400 Å. This system may be composed of a process tube of dielectric material enclosed by the electrostatic shield and a bias shield interposed between the process tube and the electrostatic shield. The bias shield may be a slotted capacitive shield and the system will further include a coating thickness monitor coupled to the process tube. The coating thickness monitor will be connected to control generation of a bias voltage that will be applied to the bias shield. This voltage will create a field that will attract ions in the plasma to the chamber side-walls to sputter etch material that has been deposited thereon.

Thus, apparatus according to the present invention for depositing layers of a conductive material can be constituted by apparatus as shown in FIGS. 1 and 3, with the addition of a process tube of dielectric material and a bias shield. The disposition of these added components relative to the components of the apparatus as shown in FIGS. 1 and 3 is illustrated in FIG. 4.

FIG. 4 shows a cross-section of the process chamber wall to illustrate the spatial relation among the exterior wall of housing 2, which is made of conductive material, coil 16, electrostatic shield 14, a bias shield 80 of conductive material and a dielectric process tube 82. As shown, coil 16, electrostatic shield 14 and bias shield 80 are immersed within a bath 84 of recirculating coolant having dielectric properties (i.e. FLUORINERT®). Coil 16 may also be formed to provide an internal channel 86 for circulation of a coolant, such as water.

Bias shield 80 is electrically isolated from electrostatic shield and housing 2 by insulators 88 to allow bias shield 80 to be biasable separately from other conductive components of the apparatus.

Electrostatic shield 14 is grounded at top and bottom. Bias shield 80 is connected to a switch 52 which allows sheet 14 to be selectively connected either to ground or to a series arrangement of a RF power supply 56 and a matching network 58. When no power is supplied, the RF circuit is capacitively coupled to ground well enough that little RF voltage appears on the bias shield and no switch is needed.

All illustrated components are of conductive material except process tube 82 and insulators 88 which are dielectric materials. For example, process tube 82 may be made of quartz or alumina. For additional details regarding the application of a bias shield, reference is made to pending International Patent Application No. PCT/US98/23248, supra.

A coating thickness monitor is preferably connected in a feedback arrangement to control the bias voltage that is applied to bias shield 80 for purposes of maintaining the desired coating thickness on the inner surface of process tube 82.

Monitoring of the thickness of the coating on the inner wall surface of process tube 82 may be based on the effect of the coating thickness on the electrical behavior of the process system, in particular the electrical impedance of the system as seen by the RF power generator 18 and matching network 20. If RF power generator 18 is operating at a fixed frequency and impedance matching network 20 comprises, in general, two variable capacitors, then the capacitance values of those capacitors can be used to determine the load impedance. An example of such a RF design is disclosed in a pending application (Johnson; TEP; PCT/US98/18497) entitled "Electrical Impedance Matching System and Method", Since matching network 20 will attempt to adjust to the changing impedance, the changing capacitance values will track these impedance changes. Thus, by monitoring these capacitance values, or the positions of control elements that vary the capacitance values, a bias voltage control feedback signal can be generated.

Alternatively, if generator 18 is a variable frequency RF power generator employed in conjunction with feedback control to vary the RF frequency, as disclosed in U.S. Pat. No. 5,688,357, Hanawa, and in U.S. Provisional Application No. 60/143,548, filed by JOHNSON on Jul. 13, 1999, entitled RADIO FREQUENCY POWER SOURCE FOR GENERATING AN INDUCTIVELY COUPLED PLASMA, then the frequency of the power produced by the generator will vary with the load impedance as seen by the generator. Therefore, the RF frequency of the generator output may replace capacitance value as a measure of the changing load impedance associated with the growth of the conductive coating.

A parameter associated with changing load impedance can be used whenever the change in load impedance is significant relative to other contributions to the change in that parameter.

Figure 5A:
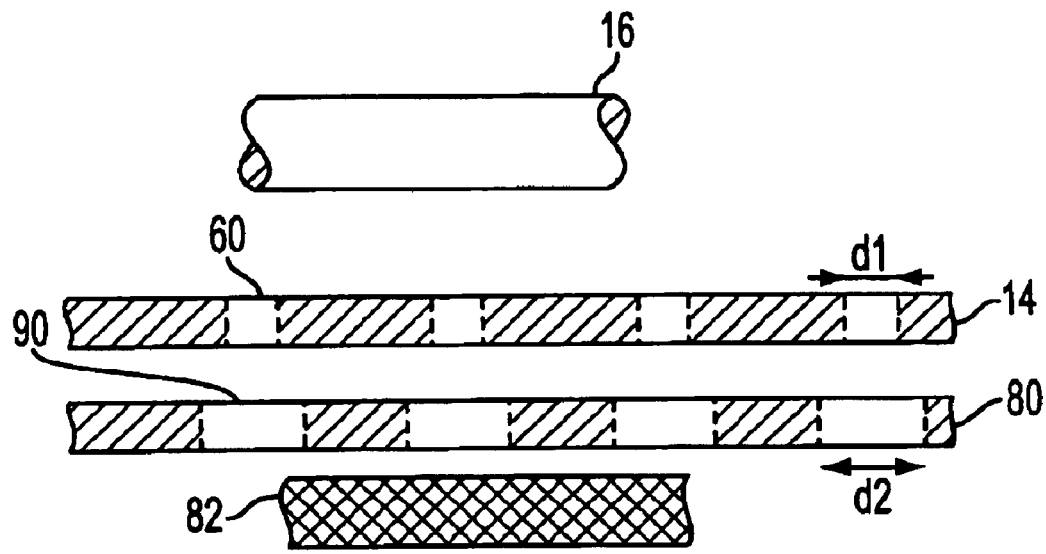
FIGS. 5A and 5b are developed views, FIG. 5A being a top plan cross-sectional detail view and FIG. 5B being a side elevational detail view, of one embodiment of components of the apparatus shown in FIG. 4.
Figure 5B:
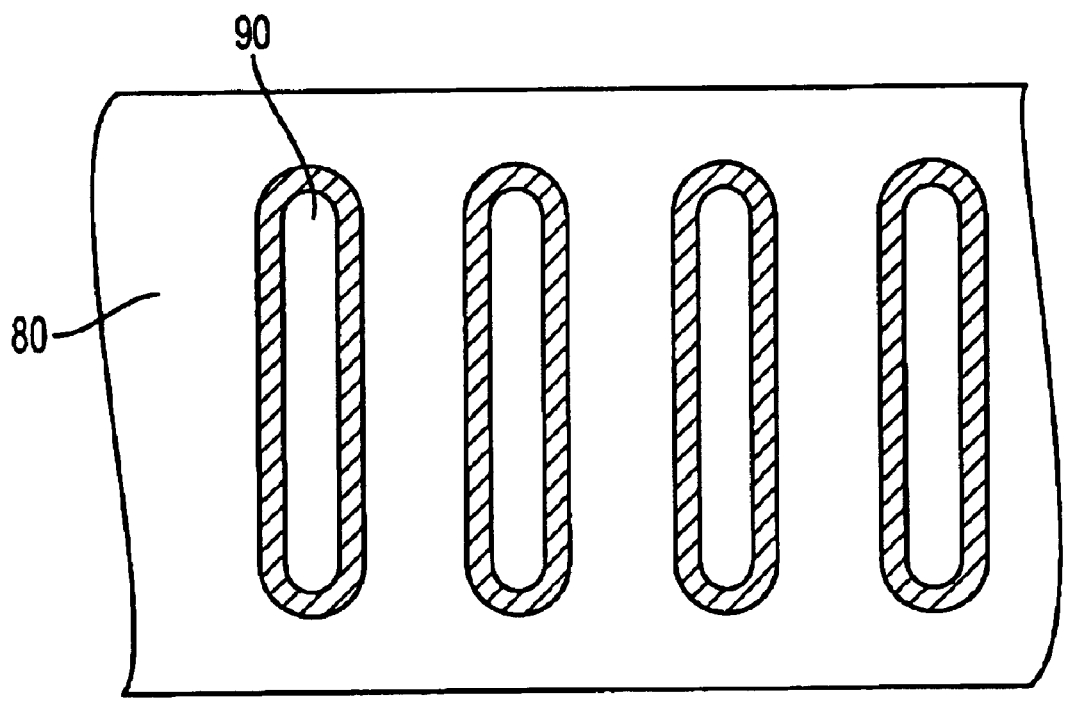

For both monitoring approaches, it is possible to incorporate a bias shield 80 that is provided with longitudinally, or vertically, extending, circumferentially spaced slots 90 similar in design to electrostatic shield 14, as shown in FIGS. 5A and 5B, which illustrates a developed, or unwrapped, electrostatic shield 14 and bias shield 80. However, the slot width d2 in bias shield 80 should preferably be slightly larger than the slot width d1 in electrostatic shield 14 in order to not interfere with the "field-of-view" of electrostatic shield slots 60, and thus to not interfere with transmission of electromagnetic energy from coil 16 to the plasma. The cross-hatched regions in FIG. 6B represent the portions of electrostatic shield 14 as seen through bias shield slots 90.

Figure 6:
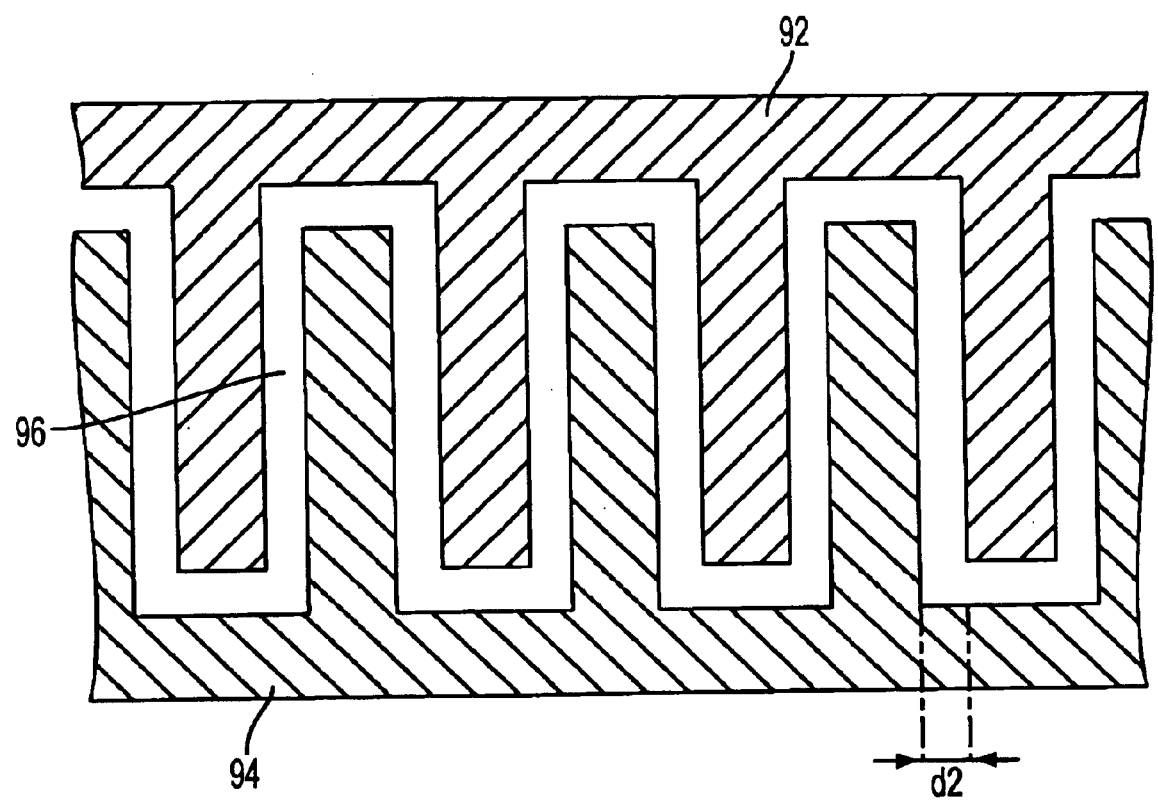
FIG. 6 is a developed side elevational detail view of a second embodiment of one of the components shown in FIGS. 5A and 5B.

In further accordance with the invention, the conductive coating thickness may be monitored by detecting a coupling signal between parts of an inter-digital bias shield, which signal will be a function of the coating thickness. FIG. 6 illustrates a bias shield of this type which is split between a top component 92 and a bottom component 94 and is arranged such that a serpentine bias shield slot 96 is created when alternating fingers of top component 92 and bottom component 94 are inter-digitally nested. The spacing $d_2$ between adjacent fingers is similar to the width of slots 90 shown in FIG. 5.

When an RF voltage differing in frequency from the RF power supplied to maintain the plasma is applied between one component of the bias shield and ground, an RF voltage can be monitored between the second component and ground to provide an indication of the thickness of the conductive wall coating. The applied voltage preferably has a low amplitude to minimize disturbance of the plasma. The frequency difference between the applied RF voltage and the frequency of the RF power supplied to maintain the plasma is employed to allow the RF voltage which is to be monitored to be separated spectrally from the RF power and enable the application of filtering techniques to identify each signal.

Figure 7A:
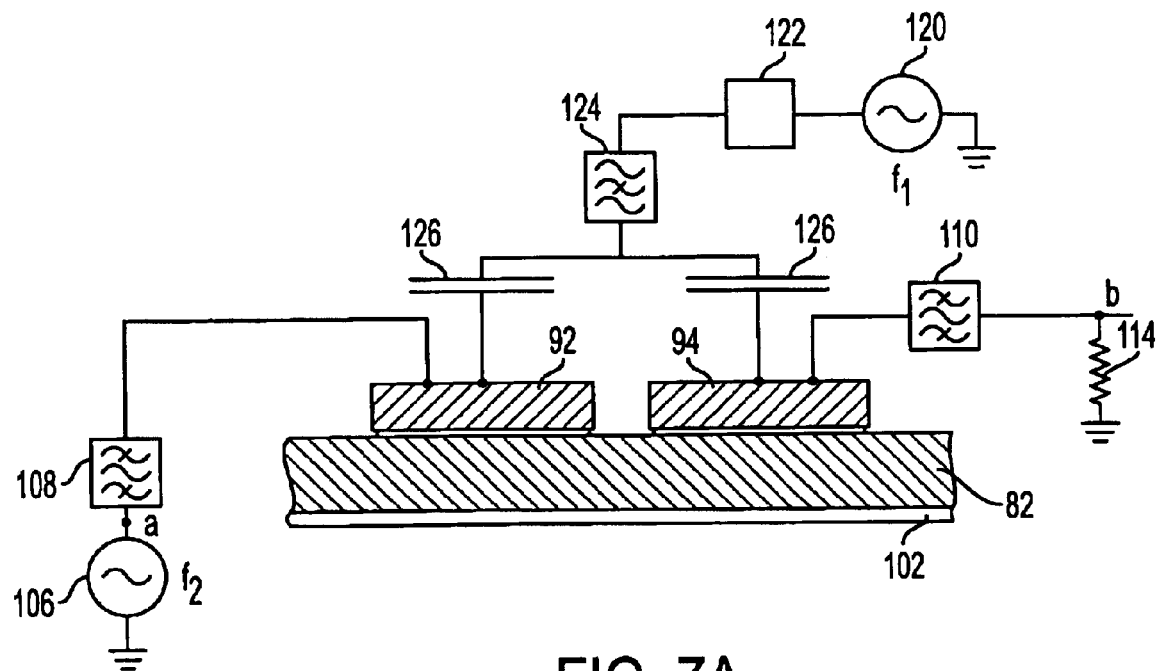
FIG. 7A is partially a developed cross-sectional plan view and partially a schematic diagram showing one embodiment of a coating thickness monitoring arrangement according to the invention.

For example, FIG. 7A presents a developed cross-sectional view of the wall cross-section of the PVD chamber (looking from the top) and a schematic diagram of a circuit for monitoring the thickness of a coating 102 of conductive material on the internal wall of process tube 82. As shown in FIG. 7A, process tube 82 is enclosed by bias shield 92, 94 and thin conductive coating 102 will form on the interior wall of process tube 82. A low amplitude voltage $V_a(t)$ of frequency $f_2$ produced by a voltage source 106 is applied at node a to component 92 via a band-pass filter 108 having a center frequency at $f_2$. The voltage applied to component 92 is capacitively coupled to component 94 of the split bias shield and it is further capacitively coupled to thin conductive wall coating 102, as well as also being partly capacitively shunted to ground through the electrostatic shield (not shown in FIGS. 7A and 7B). Additionally, conductive coating 102 is capacitively coupled to component 94. Conductive coating 102 behaves like a resistor wherein its resistance, which is dependent upon its thickness, varies with time as the coating thickness changes.

A voltage induced on component 94 passes through a band-pass filter 110 that is designed to pass only the signal content at frequency $f_2$. A measurement resistor 114 is connected between the output of band-pass filter 110, i.e., at node b, and ground. A voltage measurement is taken across resistor 114.

The ratio of the voltage amplitude between node a and ground to the voltage amplitude between node b and ground is a function of the resistance of conductive coating 102, which is directly proportional to the thickness of coating 102. This relationship may be determined theoretically, and verified and calibrated using an additional tool such as an interferometer if the material thickness is thin or an inductance thickness gauge if the material is thick.

Furthermore, FIG. 7A shows the application of RF power at a frequency fi from a RF voltage source 120 through a matching network 122, a band-reject filter 124 and two blocking capacitors 126. Blocking capacitors 126 cause the voltage provided by voltage source 120 to create a DC self-bias in bias shield 92, 94. Matching network 122, like the matching networks previously described, is provided to match the impedance of the RF voltage source 120 to its load impedance. Band-reject filter 124 is designed to reject the small amplitude AC source frequency $f_2$ applied as a measurement signal to bias shield 92, 94. Thus, filters 108, 110 and 124 are employed to decouple the RF bias voltage at frequency $f_1$ from the small amplitude detection signal at frequency $f_2$.

Figure 7B:
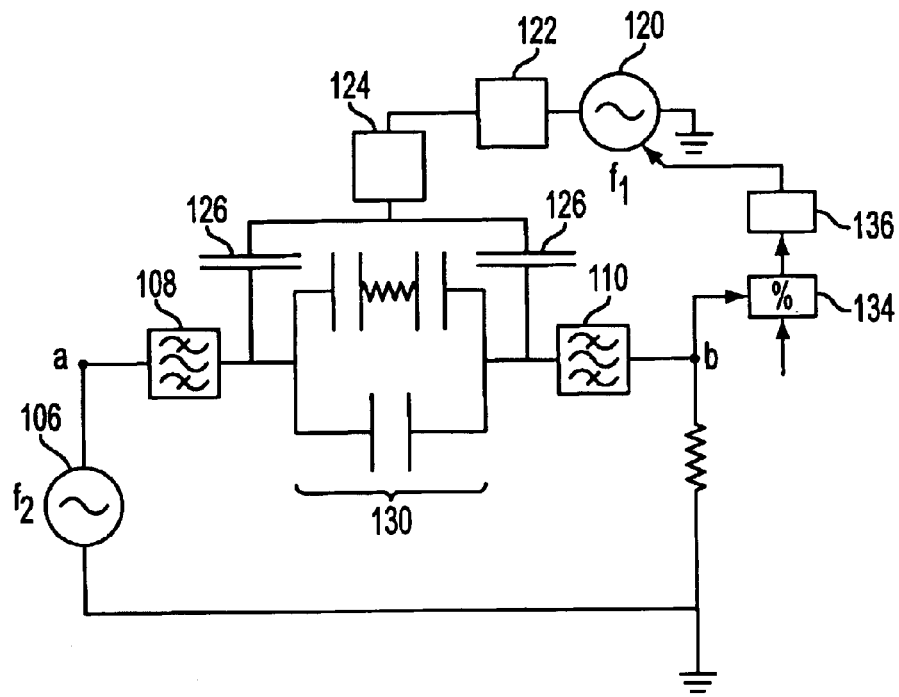
FIG. 7B is a diagram showing an equivalent circuit of the arrangement of FIG. 7A.

FIG. 7B is a circuit diagram showing the electrical circuit of FIG. 7A and an equivalent circuit 130 of components 92 and 94, process tube 82 and coating 102.

The DC self-bias created in bias shield 92, 94 may be given a magnitude sufficient to cause sputtering of material from coating 102. The bias voltage amplitude ratio between nodes a and b may be employed in any suitable manner to control the operation of voltage source 120. According to one example, as shown in FIG. 7B, nodes a and b can be connected to the inputs of an analog divider 134. Divider 134 has an output at which appears a voltage representing the ratio of the voltages at nodes a and b. This output is connected to an electrically controlled switch 136 which is connected to voltage generator 120 to control its operation. When the voltage ratio b/a rises above a value associated with a coating thickness of 400 Å, the output signal from divider 134 activates switch 136 to turn on voltage source 120. Material is then sputtered from coating 102. When the voltage ratio then rises above that value, switch 136 is deactivated and voltage source 120 is turned off.

Another problem associated with many PVD chambers, in connection with deposition of both dielectric and conductive materials, is a lack of directivity for the adatom species. As a result, when high aspect ratio vias and trenches are to be filled, the vias and trenches may be "pinched off" prematurely due to deposition coating growth on the side walls thereof. Therefore, the concept of "ion plating" was introduced wherein a large fraction of the adatom species is ionized and attracted to the substrate surface by means of a substrate bias. Consequently, the directed (normal) flow of ionized adatom species enables a more uniform coating growth without pinch-off; see U.S. Pat. No. 5,792,522.

The high density plasma source produced according to the present invention can generate a high degree of ionized target adatoms for improved ion plating and the small RF bias generated at the substrate in conjunction with a high density plasma promotes high deposition rates using combined ion enhanced deposition and ion plating.

Additionally, it is advantageous to generate the plasma used to generate "heavy ions" for sputtering the target somewhat separately from the plasma used to generate ionized adatom species for ion plating the substrate, as is done particularly in the embodiment of FIG. 3. This allows account to be taken of the fact the two functions are best performed with plasma sheaths having distinctly different characteristics.

Since it is desired, in the practice of the present invention, to create a high level of ion energy adjacent the target, special consideration must be given to cooling the target. The target must be constructed to have a substantial heat removal capability in view of the fact that a large fraction of the energy delivered to the target surface from the RF source is dissipated as heat. A smaller proportion of the delivered energy is used to overcome the potential barrier of the target material in order to dislodge it and eject it with some initial kinetic energy.

Preferably, the cooling system associated with plate 24 of FIGS. 1 and 3 is capable of removing heat at a rate in excess of 10 W/cm$^2$. This can be achieved by forming in plate 24 cooling channels in the form of spiral grooves, radial grooves, etc. designed to maximize heat transfer from plate 26 to the coolant fluid by effectively presenting a large surface area wetted by the coolant. In addition, the coolant flow path is preferably designed to accommodate high coolant flow rates by presenting a low total flow resistance, or pressure loss. These channels are preferably formed to have heat exchange ribs, etc. and to be tolerant of high flow rates, by creating a low total pressure loss. The design features adopted for the cooling system will be based on principles known in the heat exchange art and will be selected to maximize heat transfer for the existing operating conditions and coolant flow system capabilities.

To cite one example, target plate 26 and target electrode 24 can be made of aluminum and target electrode 24 can be in the form of a cooling plate containing six concentric cooling rings, each having a square cross section measuring 1 cm×1 cm in cross-section. Such a structure can achieve a maximum heat removal rate of 15 kW or a power density of 30 W/cm$^2$.

With this design, the heat removal rate, for a given temperature difference, is primarily dependent upon two heat flow mechanisms in the electrode: the conductive heat transfer through the electrode to the cooling channels; and the conductive-convective heat transfer from the electrode to the flowing coolant in the channels.

If target 26 is fabricated entirely from a metal, such as aluminum, then the conductive heat transfer coefficient is approximately an order of magnitude larger than the conductive-convective heat transfer coefficient, due primarily in part to the high thermal conductivity of aluminum (k~237 W/m-K) and the close proximity of the target surface to the cooling channels (<1 cm). Therefore, the improvements in the heat removal rate will depend primarily on the extent to which cooling system design focuses on the conductive-convective heat transfer mechanism. On the other hand, if the material of target 26 is a dielectric, cooling system design should focus more or less equally on both mechanisms.

Table 2 appearing below presents the conditions required to achieve this heat removal rate. This includes three separate sub-sets of data for a typical target thermal analysis, i.e. channel geometry, flow conditions and heat transfer. In general, the coolant utilized in semiconductor processes has good dielectric properties in order to insure minimal breakdown (i.e. arcing) between RE conductors and the ground conductor. Examples of coolants which may be used are FLUORINERT® or GALDEN HT-200® (perfluoroether). However, water cooling of the target electrode is also technically feasible since the regions within the cooling channels are not subjected to high electric fields. Moreover, water has better thermal properties than the above-mentioned fluids and can therefore be considered to be preferred for certain embodiments of the invention.

For the calculations used to produce the data presented below, a volume flow rate of 34 l/min was assumed, wherein the coolant was chosen to be Galden HT-200®. The mass flow rate and mean flow velocity are based on this assumed volume flow rate. As described earlier and as shown in Table 2, the total heat transfer coefficient includes two components, namely, the coefficient of conductive heat transfer through the target structure and the coefficient of conductive-convective heat transfer from the structure to the flowing coolant. Based on the parameter values shown in Table 2, the maximum heat removal rate and power density can be estimated to be 15 kW and 30 W/cm$^2$, respectively. Furthermore, this calculation adheres to the limitations placed upon the present cooling system design by the current cooling capacity of conventional chillers. For example, a large capacity chiller from NESLAB Instruments, Inc. (Model #HX-540) can achieve a heat removal rate of 15 kW and maintain the coolant temperature at 0° C. Additionally, the pumping capacity at a volume flow rate of 34 l/min is sufficient (by a factor of 1.5) to achieve the pressure differential indicated in Table 2.

TABLE 2

| Geometry | | Flow conditions | |
|---|---|---|---|
| Channel width, w (cm) | 1 | Volume flow rate (l/min) | 34 |
| Channel height, h (cm) | 1 | Mass flow rate, m (g/sec) | 1010 |
| Effective channel length, L$_e$ (cm) | 226.2 | Flow velocity, v (cm/sec) | 567 |
| | | Reynolds number, | 23636 |
| Hydraulic diameter, D$_h$ (cm) | 1 | Re = $\rho v D_h/\mu$ | |
| | | Nusselt number, | 249.6 |
| Effective wetted surface area, A$_w$ (cm$^2$) | 904.8 | Nu = 0.023Re$^{4/5}$Pr$^{0.3}$ | |
| | | Prandtl number, Pr = v/k | 61.5 |
| Distance from cooling channels to target surface, l (cm) | 1 | | |
| Heat transfer | | | |
| Conductive heat transfer coefficient, h$_1$ = k/l (W/cm$^2$-K) | 2.37 | | |
| Conductive-convective heat transfer coefficient, h$_2$ = Nuk/D$_h$ (W/cm$^2$-K) | 0.175 | | |
| Total heat transfer coefficient, h$_T$ = (h$_1^{-1}$ + h$_2^{-1}$)$^{-1}$ (W/cm$^2$-K) | 0.167 | | |
| Max. temperature difference between target surface and coolant, ΔT (° C.) = T$_{target}$ − T$_{coolant}$ = T$_{target}$ − 0) | 100 | | |
| Maximum heat removal rate, P = h$_T$A$_w$ΔT (W) | 15385 | | |
| Maximum power density for 254 cm diameter target, W/cm$^2$ | 30.4 | | |
| Pressure difference to achieve coolant flow, ΔP = 0.017$\rho$(L$_e$/D$_h$)(V$^2$/2) (kPa) | 220 | | |

The calculations summarized above place a maximum power limit sustainable by the target while maintaining a pre-specified target surface temperature. Following the initial discussion of ion sputter rate, this sets some level upon the combined values of the ion energy and the ion flux and, therefore, some trade-off relationship between them.

Figure 8:
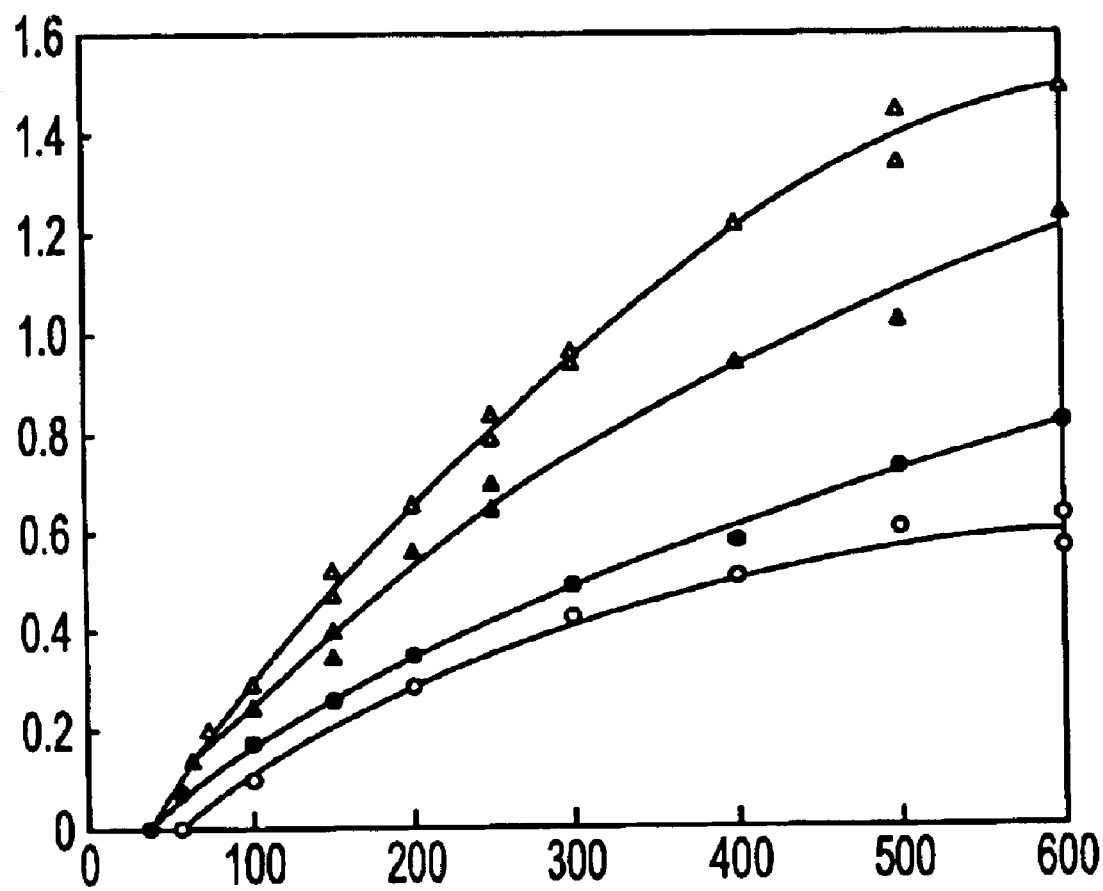
FIG. 8 is a diagram showing the variation of sputtering yield with ion energy for several target compositions.

FIG. 8 shows the variation of sputtering yield (atoms/ion) with ion energy (eV) for several target compositions: Ta, Hf, Fe and Ni, listed in order of increasing sputtering yield/ion energy), wherein Argon was the sputtering ion species. As the ion energy increases, the sputtering yield increases at a decaying rate. For these materials, sputtering yield efficiency can be optimized at ion energies somewhere between 200 and 400 eV. This corresponds to a maximum ion current density range of 148 to 74 mA/cm$^2$, respectively. This corresponds to a plasma density of approximately 2×10$^{12}$ cm$^{-3}$ in close proximity to the target surface. An ESRF plasma source of this size is capable of these plasma densities with the application of 10 to 20 kW of RF power at 13.56 MHz. However, to achieve these conditions, the target must be designed to have a low impedance, at the RF frequency, of the order several ohms to tens of ohms.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. An apparatus for performing physical vapor deposition of a layer on a substrate, said apparatus comprising:
    a deposition chamber enclosing a plasma region for containing an ionizable gas;
    an electromagnetic field generator surrounding said plasma region for inductively coupling an electromagnetic field into said plasma region to ionize the gas and generate and maintain a high density, low potential plasma;
    a source of deposition material including a solid target constituting a source of material to be deposited onto the substrate;
    an electrical bias circuit associated with said target adapted to electrically bias said target in order to cause ions in the plasma to strike said target and sputter material from said target; and
    a substrate holder for holding the substrate at a location to permit material sputtered from said target to be deposited on the substrate,
    wherein said electromagnetic field generator comprises:
        a source of RF electrical power;
        an electrostatic shield surrounding said plasma region, said electrostatic shield is a conductive member having regions that allow passage of RF electromagnetic energy, which regions have a lower bound that is not lower than the location of a substrate held by said substrate holder; and
        a coil surrounding said shield and coupled to said source of RF electrical power for converting RF power from said source into the electromagnetic field that is coupled into said plasma region; and
        a voltage source adapted to apply a DC bias to said shield.

2. The apparatus of claim 1, wherein said electrical bias circuit imparts a first energy level to ions attracted to said target and wherein said apparatus further comprises an ion attractor configured to attract ions to the substrate by imparting a second energy level to ions adjacent the substrate, the second energy level being lower than the first energy level.

3. The apparatus of claim 2 wherein said electrical bias circuit imparts a first energy level using a first source of RF power coupled to said source of deposition material to induce a DC self-bias in said target.

4. The apparatus of claim 3 wherein said first source of RF power provides an RF current at a frequency greater than 0.5 MHz.

5. The apparatus of claim 4 wherein said first source of RF power comprises an RF power generator and an impedance matching network connected between said RF power generator and said target for minimizing delivery to said target of power at harmonics of the frequency of the RF current.

6. The apparatus of claim 5 wherein said source of deposition material comprises:
    a metal plate to which said target is affixed; and
    a cooling system thermally coupled to said target for removing heat from said target at a high rate.

7. The apparatus of claim 6 wherein said first source of RF power is capacitively coupled to said target.

8. The apparatus of claim 1, wherein said substrate holder comprises an electrostatic holder configured to apply an electrostatic force to the substrate to hold the substrate.

9. The apparatus of claim 1 wherein said target is a source of dielectric material to be deposited.

10. The apparatus of claim 1 wherein said target is a source of conductive material to be deposited.

11. An apparatus for performing physical vapor deposition of a layer on a substrate, said apparatus comprising:
    a deposition chamber enclosing a plasma region for containing an ionizable gas;
    an electromagnetic field generator surrounding said plasma region for inductively coupling an electromagnetic field into said plasma region to ionize the gas and generate and maintain a high density, low potential plasma;
    a source of deposition material including a solid target constituting a source of material to be deposited onto the substrate;
    an electrical bias circuit associated with said target to electrically bias said target in order to cause ions in the plasma to strike said target and sputter material from said target; and
    a substrate holder for holding the substrate at a location to permit material sputtered from said target to be deposited on the substrate,
    wherein said substrate holder comprises:
        an electrostatic holder configured to apply an electrostatic force to the substrate to hold the substrate;
        a gas supply configured to supply and bring gas into contact with the substrate;
        a heat exchanger configured to remove heat at a high rate from the substrate; and
        a voltage bias source adapted to induce a DC bias in the substrate, wherein said electromagnetic field generator comprises:
            a source of RF electrical power;
            an electrostatic shield surrounding said plasma region; and
            a coil surrounding said shield and coupled to said source of RF electrical power for converting RF power from said source into the electromagnetic field that is coupled into said plasma region.

12. An apparatus for performing physical vapor deposition of a layer on a substrate, said apparatus comprising:
    a deposition chamber enclosing a plasma region for containing an ionizable gas;
    an electromagnetic field generator surrounding said plasma region for inductively coupling an electromagnetic field into said plasma region to ionize the gas and generate and maintain a high density, low potential plasma;
    a source of deposition material including a solid target constituting a source of conductive material to be deposited onto the substrate;
    an electrical bias circuit associated with said target to electrically bias said target in order to cause ions in the plasma to strike said target and sputter material from said target; and
    a substrate holder for holding the substrate at a location to permit material sputtered from said target to be deposited on the substrate,
    wherein said deposition chamber comprises a wall of dielectric material delimiting the plasma region.

13. The apparatus of claim 12 further comprising a bias shield surrounding said wall for generating a bias voltage that cooperates with a plasma in said plasma region to sputter deposited material off of said wall, wherein deposition material is deposited on the wall during a vapor deposition operation.

14. The apparatus of claim 13 further comprising a monitoring component coupled to said bias shield configured to monitor the thickness of material deposited on said wall and a voltage controller configured to control generation of the bias voltage to maintain the thickness below a predetermined value.

15. The apparatus of claim 14 wherein said monitoring component is electrically connected to said bias shield for producing an output signal representative of the electrical resistance of the layers deposited on said wall, in a direction perpendicular to said wall.

16. The apparatus of claim 15 wherein said bias shield has first and second parts that are electrically isolated from one another, and said monitoring component comprises a voltage source connected to said first part and a voltage detector connected to said second part for generating the output signal.

17. The apparatus of claim 13 wherein:
the plasma generated in said plasma region has an impedance which constitutes an output impedance of said electromagnetic field generator;
said electromagnetic field generator comprises:
a source of RF electrical power, and
an impedance matching network coupled between said source and said plasma region for maintaining efficient energy transfer from said source to the plasma generated in said plasma region, said impedance matching network having at least one electrical component having a component impedance which varies in response to variations in the impedance of the plasma; and
said apparatus further comprises a monitoring component coupled to said electrical component configured to monitor the component impedance and to control generation of the bias voltage as a function of the monitored component impedance to maintain the thickness below a predetermined value.

18. The apparatus of claim 13 wherein:
the plasma generated in said plasma region has an impedance which constitutes an output impedance of said electromagnetic field generator;
said electromagnetic field generator comprises a source of variable frequency RF electrical power having a frequency which varies in response to variations in the impedance of the plasma; and
said apparatus further comprises a voltage-frequency monitoring component coupled to said source of variable frequency RF electrical power electrical to monitor the frequency of electrical power and to control generation of the bias voltage as a function of the monitored frequency to maintain the thickness below a predetermined value.

19. A method for performing physical vapor deposition of a layer on a substrate, said method comprising:
providing a deposition chamber enclosing a plasma region and containing a solid target constituting a source of conductive material to be deposited in vapor form onto the substrate, and a substrate holder holding the substrate;
introducing an ionizable gas into the plasma region;
inductively coupling an electromagnetic RF field into the plasma region under conditions to ionize the gas and create a high density, low potential plasma;
biasing the target in order to cause ions in the plasma to strike the target and sputter material from the target; and
causing material sputtered from the target to be deposited as a layer on the substrate,
wherein the deposition chamber comprises a wall of dielectric material delimiting the plasma region.

20. The method of claim 19 further comprising attracting ions to the target by imparting a first energy level to the ions, and attracting ions to the substrate by imparting a second energy level to the ions, and wherein the first energy level is higher than the second energy level.

21. The method of claim 20 wherein said biasing the target comprises supplying RF power at a fundamental frequency to the target and minimizing power at harmonics of the fundamental frequency at the target.

22. (The method of claim 19 further comprising holding the substrate on the substrate holder by using an electrostatic force.

23. The method of claim 19 further comprising disposing a bias shield around the wall and generating a bias voltage, with the aid of the bias shield, that cooperates with a plasma in the plasma region to sputter deposited material off of the wall, wherein deposition material is deposited on the wall during a vapor deposition operation.

24. The method of claim 23 further comprising monitoring the thickness of material deposited on the wall and controlling generation of the bias voltage to maintain the thickness below a predetermined value.

25. The method of claim 24 wherein said monitoring the thickness of material deposited on the wall comprises obtaining an output signal from the bias shield representative of the electrical resistance of the layers deposited on the wall, in a direction perpendicular to the wall.

26. The method of claim 25 wherein the bias shield has first and second parts that are electrically isolated from one another, and said monitoring the thickness of material deposited on the wall comprises connecting a voltage source to the first part and a voltage detector to the second part for generating the output signal.

27. The method of claim 24 wherein:
said inductively coupling an electromagnetic RF field into the plasma region comprises:
generating RF electrical power from a power source, and coupling the RF electrical power from the source to the plasma region via an impedance matching network that maintains efficient energy transfer from the source to the plasma generated in said plasma region, said impedance matching network having at least one electrical component having a component impedance which varies in response to variations in the impedance of the plasma;
the plasma generated in the plasma region has an impedance which constitutes an output impedance of the power source; and
said monitoring the thickness of material deposited on the wall comprises determining the value of the component impedance and controlling generation of the bias voltage as a function of the component impedance value to maintain the thickness of the material deposited on the wall below a predetermined value.

28. The method of claim 24 wherein:
said inductively coupling an electromagnetic RF field into the plasma region comprises generating RF electrical power from a source of variable frequency RF electrical power having a frequency which varies in response to variations in the impedance of the plasma;
the plasma generated in the plasma region has an impedance which constitutes an output impedance of the power source; and said monitoring the thickness of material deposited on the wall comprises determining the frequency of the electrical power and controlling generation of the bias voltage as a function of the determined frequency to maintain the thickness of the material deposited on the wall below a predetermined value.

* * * * *